(12) United States Patent
Kono

(10) Patent No.: US 10,734,376 B2
(45) Date of Patent: Aug. 4, 2020

(54) SEMICONDUCTOR DEVICE

(71) Applicant: DENSO CORPORATION, Kariya, Aichi-pref. (JP)

(72) Inventor: Kenji Kono, Kariya (JP)

(73) Assignee: DENSO CORPORATION, Kariya (JP)

( * ) Notice: Subject to any disclaimer, the term of this patent is extended or adjusted under 35 U.S.C. 154(b) by 2 days.

(21) Appl. No.: 16/250,094

(22) Filed: Jan. 17, 2019

(65) Prior Publication Data

US 2019/0148365 A1    May 16, 2019

Related U.S. Application Data

(63) Continuation of application No. PCT/JP2017/023901, filed on Jun. 29, 2017.

(30) Foreign Application Priority Data

Jul. 21, 2016    (JP) ................. 2016-143299

(51) Int. Cl.
*H01L 27/06*    (2006.01)
*H01L 29/06*    (2006.01)
(Continued)

(52) U.S. Cl.
CPC ...... *H01L 27/0635* (2013.01); *H01L 27/0727* (2013.01); *H01L 29/0696* (2013.01); *H01L 29/0834* (2013.01); *H01L 29/407* (2013.01); *H01L 29/7391* (2013.01); *H01L 29/7397* (2013.01); *H01L 24/05* (2013.01); *H01L 24/06* (2013.01); *H01L 2224/04042* (2013.01); *H01L 2224/05554* (2013.01); *H01L 2224/06131* (2013.01); *H01L 2224/06135* (2013.01);
(Continued)

(58) Field of Classification Search
CPC ............ H01L 24/05; H01L 24/06; H01L 2224/04042; H01L 2224/05554; H01L 2224/06131; H01L 2224/06135; H03K 17/127; H03K 17/567
See application file for complete search history.

(56) References Cited

U.S. PATENT DOCUMENTS 6,323,717 B1   11/2001   Omura et al.
7,112,868 B2    9/2006   Willmeroth et al.
(Continued)

FOREIGN PATENT DOCUMENTS

JP    2007-324539 A    12/2007
JP    2010-109545 A     5/2010
(Continued)

*Primary Examiner* — Seahvosh Nikmanesh
(74) *Attorney, Agent, or Firm* — Posz Law Group, PLC

(57) ABSTRACT

A semiconductor device includes IGBT devices; and a freewheeling diode provided for each IGBT device. The IGBT devices are connected in parallel to be driven. Each IGBT device includes: a collector region; a drift region; a body region; a trench gate penetrating the body region; and an emitter region surrounded by the body region and in contact with the trench gate. Each IGBT device further includes an active cell with the emitter region; a dummy cell without the emitter region; and an active dummy cell without the emitter region. The active dummy cell has a float cell where the body region is in electrically-floating condition. A ratio of the number of float cell to the total number of the active cell and the active dummy cell is larger than or equal to 5% and is smaller than or equal to 35%.

4 Claims, 5 Drawing Sheets

(51) Int. Cl.
  *H01L 27/07*   (2006.01)
  *H01L 29/40*   (2006.01)
  *H01L 29/739*  (2006.01)
  *H03K 17/12*   (2006.01)
  *H01L 23/00*   (2006.01)
  *H03K 17/567*  (2006.01)
  *H01L 29/08*   (2006.01)

(52) U.S. Cl.
  CPC .. *H01L 2924/00014* (2013.01); *H03K 17/127* (2013.01); *H03K 17/567* (2013.01)

(56) References Cited

U.S. PATENT DOCUMENTS

| | | |
|---|---|---|
| 7,868,397 B2 | 1/2011 | Tsukuda et al. |
| 2001/0054738 A1 | 12/2001 | Momota et al. |
| 2004/0084722 A1 | 5/2004 | Yamaguchi et al. |
| 2004/0207009 A1 | 10/2004 | Yamaguchi et al. |
| 2005/0151187 A1 | 7/2005 | Wakimoto et al. |
| 2006/0006409 A1 | 1/2006 | Yamaguchi et al. |
| 2007/0075331 A1 | 4/2007 | Wakimoto et al. |
| 2007/0114570 A1 | 5/2007 | Yamaguchi et al. |
| 2009/0189181 A1 | 7/2009 | Koyama et al. |
| 2009/0242931 A1 | 10/2009 | Tsuzuki et al. |
| 2010/0090248 A1 | 4/2010 | Kouno |
| 2011/0012195 A1 | 1/2011 | Momota et al. |
| 2011/0220962 A1 | 9/2011 | Koyama et al. |
| 2012/0132954 A1 | 5/2012 | Kouno et al. |
| 2014/0197451 A1 | 7/2014 | Chen et al. |
| 2015/0243772 A1 | 8/2015 | Chen et al. |
| 2016/0372460 A1 | 12/2016 | Momota et al. |

FOREIGN PATENT DOCUMENTS

| | | |
|---|---|---|
| JP | 2010-135677 A | 6/2010 |
| JP | 4676125 B2 | 4/2011 |
| JP | 2011-176244 A | 9/2011 |
| JP | 5135719 B2 | 2/2013 |
| JP | 5186868 B2 | 4/2013 |

SEMICONDUCTOR DEVICE

CROSS REFERENCE TO RELATED APPLICATIONS

The present application is a continuation application of International Patent Application No. PCT/JP2017/023901 filed on Jun. 29, 2017, which designated the U.S. and claims the benefit of priority from Japanese Patent Application No. 2016-143299 filed on Jul. 21, 2016. The entire disclosures of all of the above applications are incorporated herein by reference.

TECHNICAL FIELD

The present disclosure relates to a semiconductor device.

BACKGROUND

A typical semiconductor device is configured to connect a plurality of switching devices in parallel and to turn on or off at a proper moment for reducing a switching loss and controlling output current.

Parasitic inductance may be generated between the switching devices in the semiconductor device in which the switching devices are connected in parallel. For this reason, an induced electromotive force may be generated during the switching to generate voltage oscillation and current oscu- lation caused by the voltage oscillation.

SUMMARY

The present disclosure provides a semiconductor device including a plurality of switching devices connected in parallel and a freewheeling diode provided for each switch- ing device.

BRIEF DESCRIPTION OF DRAWINGS

The above object, the other objects, features, and advan- tages of the present disclosure will become more apparent from the following detailed description with reference to the accompanying drawings, in which.

DETAILED DESCRIPTION

Figure 1:
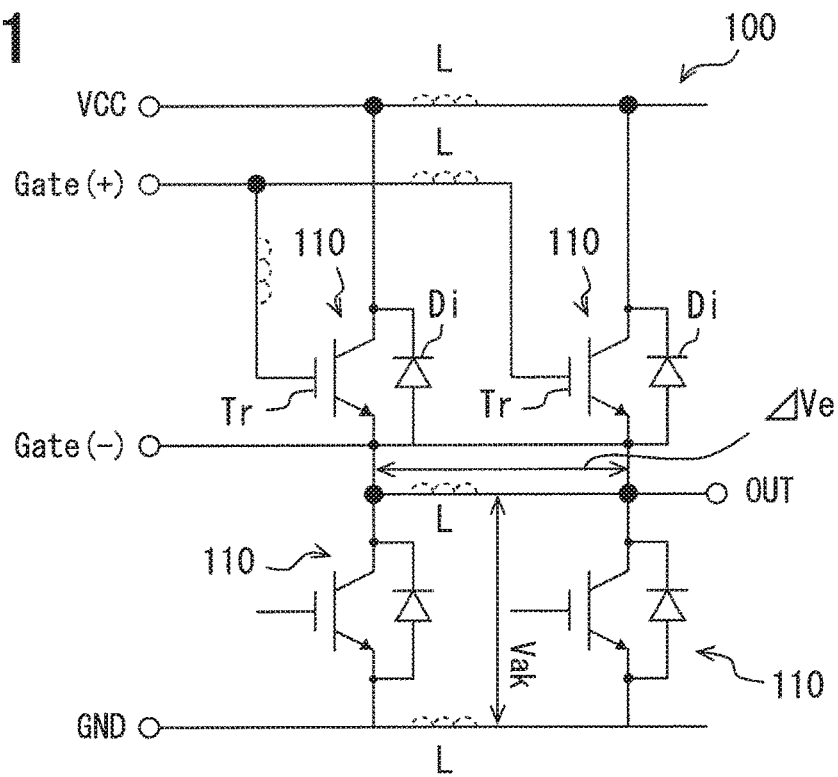
FIG. 1 is a circuit diagram showing a schematic configu- ration of a semiconductor device according to a first embodi- ment.

For the voltage oscillation, in a situation of using, for example, an insulated gate bipolar transistor (IGBT) as a switching device, a thinning structure in which an emitter region is not formed in a part of a cell may be adopted. With regard to the thinning structure, in a thinning portion without forming the emitter region, the body region where a channel is formed is connected to an emitter electrode, and is at the emitter's potential level (generally, the ground) when the switching device is turned on.

By adjusting a value of resistance existing between the body region and the emitter electrode, it is possible to control each amount of waveform distortion caused by switching speed, turn-on voltage, voltage oscillation and freewheeling diode (FWD).

For example, when the resistance value is set to be a smaller value, the holes easily leak out so that the switching speed is in increase but the turn-on voltage and voltage oscillation are also in increase.

On the other hand, when the resistance value is set to be a larger value, an increase in the turn-on voltage and voltage oscillation may be suppressed; however, the waveform distortion caused by FWD may be in increase.

In other words, by merely adjusting the resistance value, it may be difficult to eliminate a tradeoff among switching speed, turn-on voltage, voltage oscillation and waveform distortion caused by a freewheeling diode (FWD).

According to an aspect of the present disclosure, a semi- conductor device includes a plurality of IGBT devices and a freewheeling diode provided for each of the IGBT devices. The plurality of IGBT devices are connected in parallel to be driven. Each of the IGBT devices includes: a collector region having a first conductivity type; a drift region having a second conductivity type stacking on the collector region; a body region having the first conductivity type stacking on the drift region; a plurality of trench gates penetrating the body region and reaching the drift region; and an emitter region surrounded by the body region and in contact with at least one of the plurality of trench gates through an insula- tion film. Each of the IGBT devices further includes: an active cell having at least one of the trench gates applied with a gate voltage, and having the emitter region; a dummy cell having at least one of the trench gates at a same potential level as the emitter region, and without the emitter region; and an active dummy cell having at least one of the trench gates applied with the gate voltage, and without the emitter region. The active dummy cell includes a float cell in which the body region is in an electrically floating condition. A ratio of a number of the float cell to a total number of the active cell and the active dummy cell is larger than or equal to 5% and is smaller than or equal to 35%.

The present inventor found out that the waveform distor- tion caused by the freewheeling diode (FWD) deteriorates as the ratio of the number of float cells to the total number of active cells and active dummy cells is in increase. Addition- ally, the present inventor also found out that the voltage oscillation caused by parallel connection and driving dete- riorates as the ratio of the number of float cells to the total number of the active dummy cells and active cells is in decrease. By setting a range from 5% to 35% for the ratio of the number of float cells with respect to the total number of the active cells and the active dummy cells, it is possible to reduce the voltage oscillation while reducing the waveform distortion.

Embodiments of the present disclosure will be hereinafter described with reference to the drawings. Parts identical or equivalent to each other among various drawings are given the same reference numerals.

First Embodiment

First, a schematic configuration of a semiconductor device 100 in accordance with the present embodiment will be described with reference to FIG. 1.

For example, the semiconductor device according to the preset embodiment is provided to a switching circuit in which reverse-conducting insulated gate bipolar transistors (RC-IGBT) are connected in parallel to obtain an output current.

FIG. 1 is a circuit diagram showing the configuration of a semiconductor device 100 according to the present embodiment. With regard to the semiconductor device 100, the switching devices 110 are connected in series between the power supply VCC and the ground level as a reference potential level. Also, the switching devices 110 are provided in two groups, and the two groups are connected in parallel. In other words, the plurality of switching devices 110 are connected in parallel with reference to the power supply VCC. The switching device 110 includes an IGBT device Tr. According to the present embodiment, two IGBT devices Tr are connected in parallel between the power supply VCC and the output OUT. The collector terminal of the IGBT device Tr at the upper section is connected to the power supply VCC, and the emitter terminal is connected to the output OUT. The gate terminal of each IGBT device Tr is configured to receive a gate voltage. The collector terminal of the IGBT device at the lower section is connected to the output OUT, and the emitter terminal is connected to the ground. The IGBT devices Tr at the lower section are connected in parallel with respect to the output OUT.

The switching device 110 in the semiconductor device 100 according to the present embodiment is an RC-IGBT, and includes a freewheeling diode Di. An anode terminal of each freewheeling diode Di is connected to an emitter terminal of the IGBT device Tr.

The parasitic inductance L is generated between the switching devices 110, which are connected in parallel. FIG. 1 illustrates that, as an example, a parasitic inductance L is generated in the connection wiring between the power supply VCC and the switching device 110, the gate wiring, and the emitter wiring of the IGBT device Tr. However, the parasitic inductance L may also be generated at, for example, Kelvin emitter wiring or other wiring.

Figure 2:
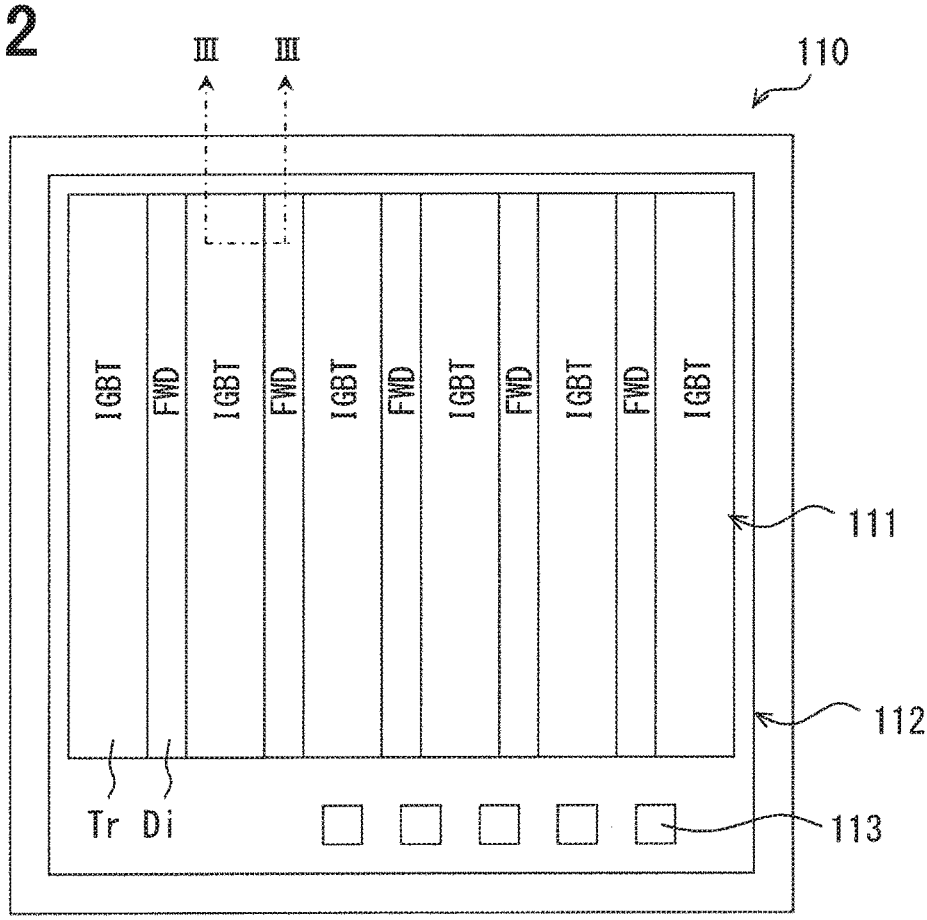
FIG. 2 is a top view illustrating a schematic configuration of a switching device.
Figure 3:
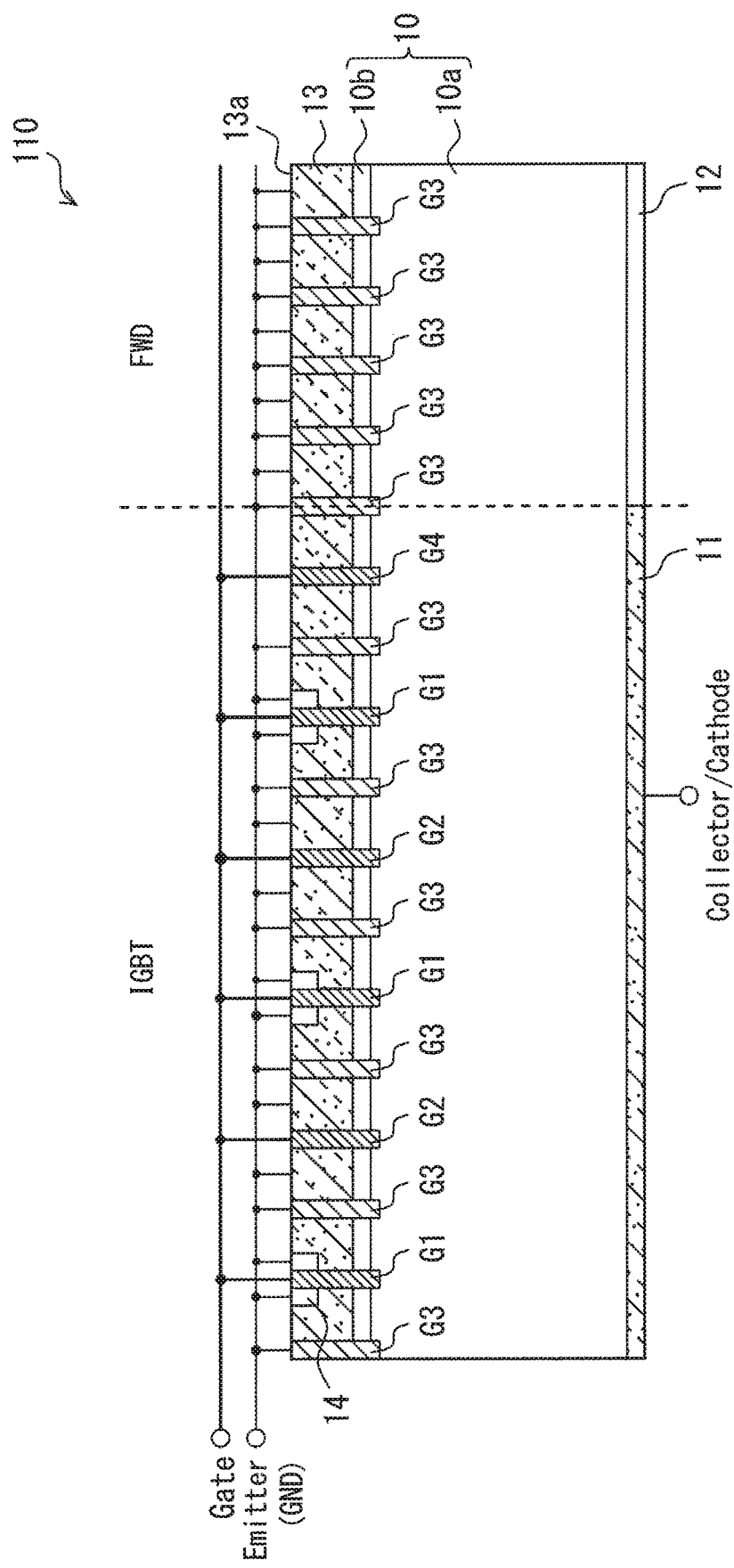
FIG. 3 is a cross-sectional view of FIG. 2 taken along the line III-III.
Figure 4:
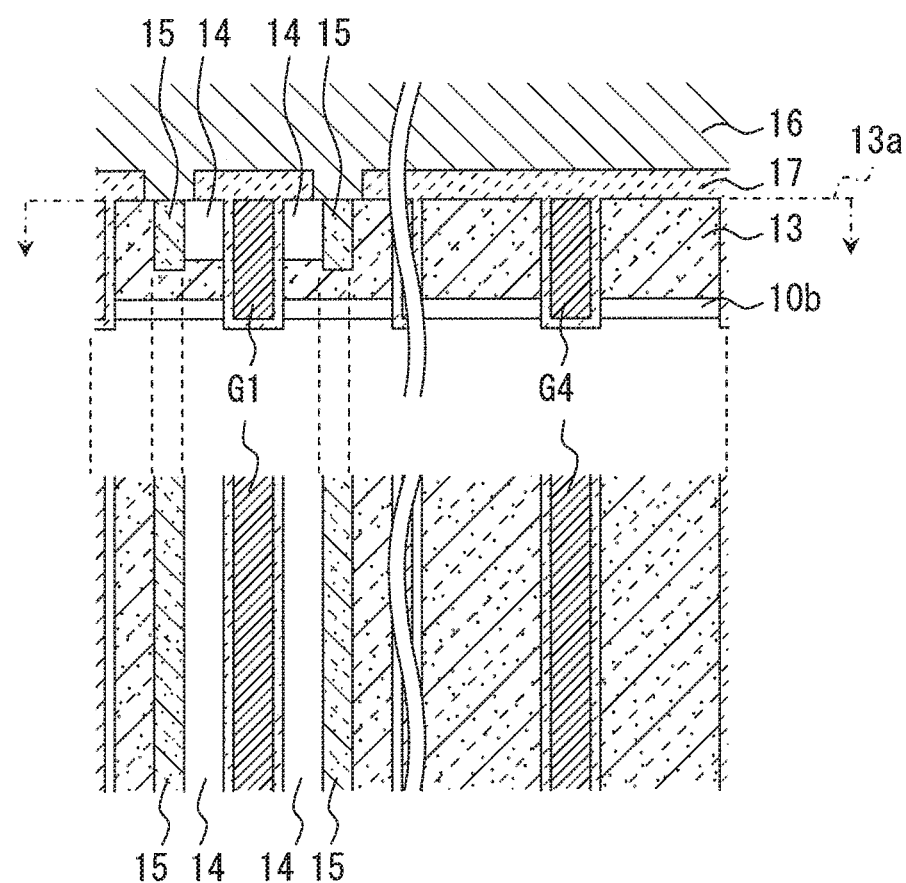
FIG. 4 is a cross-sectional view of an active cell and a float cell in detail.

The following describes the configuration of the IGBT device Tr and the freewheeling diode Di in detail with reference to FIGS. 2 to 4. The plurality of switching devices 110 are equivalent to each other. In other words, since the IGBT devices Tr are equivalent to each other, and the freewheeling diodes Di are equivalent to each other, only one switching device 110 is described in the following.

The switching device 110 is arranged at the semiconductor substrate. As shown in FIG. 2, the switching device 110 includes a cell region 111 and a non-cell region 112. In the cell region 111, the IGBT device Tr and the freewheeling diode Di are formed. The non-cell region 112 is located at the periphery of the cell region 110

A pad 113 is formed at the non-cell region 112 for making an external electrical connection. A bonding wire (not shown) is connected to the pad 113. For example, the power supply VCC or the gate voltage is sent to the cell region 111 through the pad 113. The wiring such as the connection wiring between the power supply VCC and the switching device 110, the gate wiring, the emitter wiring of the IGBT device Tr and the Kelvin emitter wiring is extended from the pad 113 to the cell region 111. When the plurality of switching devices 110 to be connected in parallel are mounted so as to be closed to each other, the parasitic inductance L is generated between the wirings.

The cell region 111 includes: an IGBT cell formed with the IGBT device Tr; and a diode cell formed with the freewheeling diode Di. The IGBT cells and the diode cells are extended in the same direction, and form a strip-shaped structure arranged alternatively in a direction perpendicular to the extending direction.

The detailed configuration of the IGBT cell and the diode cell is described with reference to FIG. 3. FIG. 3 is a cross-sectional view taken along the line III-III illustrated in FIG. 2. In FIG. 3, hatching is drawn on the after-mentioned trench gates G1 to G4 and a semiconductor region having p-type conductivity. Hatching is not drawn on a semiconductor region having n-type conductivity. As shown in FIG. 3, as the broken line is regarded as the boundary, the left side of the drawing refers to the IGBT device Tr, and the right side of the drawing refers to the freewheeling diode Di.

The IGBT cell includes a drift region 10 having n-type conductivity, a collector region 11 having p-type conductivity, a body region 13 having p-type conductivity, and an emitter region 14 having n-type conductivity. The drift region 10, the collector region 11, the body region 13 and the emitter region 14 are regarded as the semiconductor regions. The IGBT cell includes trench gates G1 to G4.

The drift region 10 is stacked on the collector region 11. The body region 13 is stacked on the drift region 10. The body region 13 is exposed to the surface 13a of the semiconductor substrate, and the emitter electrode (not shown) is connected to the body region 13. The trench gates G1 to G4 penetrate the body region 13 from the surface 13a and reaches the drift region 10. The trench gates G1 to G4 are in contact with the body region 13 and the drift region 10 through an insulation film (not shown). The drift region 10 has a charge accumulation region 10b at a contact surface layer in contact with the body region 13. The charge accumulation region 10b is configured to have a higher impurity concentration than other parts of the drift region 10. In other words, the drift region 10 includes the charge accumulation region 10b and a portion 10a excluding the charge accumulation region 10b.

The trench gates G1 to G4 according to the present embodiment are structurally equivalent to each other. However, they are classified into two types depending on gate voltages to be applied to the trench gates G1 to G4. In other words, the trench gates are classified into active gates G1, G2 and G4 applied with the gate voltage and a dummy gate G3 connected to the emitter's potential level (for example, ground level: GND) in replacement of the gate voltage.

Furthermore, the active gates are further classified into the trench gate G1 in contact with the emitter region 14 through an insulation film and the active dummy gate G2 not in contact with the emitter region 14. The emitter region 14 is connected with an emitter electrode (not shown), and is at the emitter's potential level (GND). A portion of the body region 13 where the emitter region 14 is not formed is connected to an emitter electrode so as to be at the emitter's potential level.

The trench gates G1 to G4 are provided along an extending direction of the IGBT cell. In a direction perpendicular to the extending direction of the IGBT cell, the trench gates according to the present embodiment are arranged such that the active gate G1, G2, or G4 and the dummy gate G3 are provided alternately. With regard to the active gates G1, G2 and G4, the trench gate G1 and the active dummy gate G2 are alternately arranged in a direction perpendicular to the extending direction. The trench gate G1 is in contact with the emitter region 14.

In this specification, a cell including the trench gate G1 in contact with the emitter region 14 and the body region 13 formed to sandwich the trench gate G1 is referred to as an active cell. A cell including the active dummy gate G2 and the body region 13 formed to sandwich the active dummy gate G2 is referred to as an active dummy cell. A cell including the dummy gate G3 and the body region 13 formed to sandwich the dummy gate G3 is referred to as a dummy cell.

In the present embodiment, a portion of the active dummy cell is configured as a float cell in which the body region 13 is not connected to the emitter's potential level but is in electrically floating. In FIG. 3, the active dummy gate denoted by the reference symbol G4 is a trench gate belonging to the float cell. In FIG. 3, the body region 13 with both sides in contact with the trench gate G4 is in a floating condition in which the body region 13 is not connected to the emitter's potential level. In this embodiment, the number of float cell is one. For example, when one side of the body region 13 is in the floating condition, the number of float cell is counted as 0.5.

The configuration of the active cell in which the body region 13 is at the emitter's potential level and the configuration of the float cell in which the body region 13 is electrically floating are described with reference to FIG. 4.

With regard to the active cell, a contact region 15 having p-type conductivity is formed to be enclosed by the body region 13. The contact region 15 is configured to have a higher impurity concentration as compared with the body region 13. The contact region 15 is electrically connected to the emitter electrode 16, which is at the emitter's potential level. Thus, the body region 13 is at the emitter's potential level. The trench gate G1 and the emitter electrode 16 are electrically separated by the insulation film 17. In the present embodiment, the trench gate G1 is extended in one direction, and the emitter region 14 and the contact region 15 are extended along the trench gate G1. These are formed in a strip-shape as viewed from the upper surface.

On the other hand, with regard to the float cell, the body region 13 and the emitter electrode 17 are electrically insulated by the insulation film 17, and the body region 13 is in the floating condition.

As illustrated in FIG. 3, with regard to the trench gates in the present embodiment, the active gates G1, G2, G4 and the dummy gate G3 are alternatively arranged. With regard to the active gates, the trench gate G1 and the active dummy gate G2 are alternatively arranged. In other words, the active cell and the dummy cell are arranged adjacent to each other, and a part of the body region 13 included in the cell is shared by both cells. The dummy cell and the active dummy cell are arranged to be adjacent to each other. A part of the body region 13 included in the cell is shared by both cells.

With regard to the IGBT cell in the present embodiment, three active cells and three active dummy cells (including one float cell) are made into one cell group as a unit, and each cell is periodically arranged. In other words, the number of float cells according to the present embodiment is one. The total number of the active cells and the active dummy cells is six. The ratio of the number of float cells to the total number of the active cells and the active dummy cells is 16.7% (obtained through one divided by six).

On the other hand, the diode cell includes: a drift region 10 shared with the IGBT cell; a body region 13 shared with the IGBT cell; and a cathode region 12 having n-type conductivity formed opposite to the body region 13 with respect to the drift region 10. The cathode region 12 is formed on the same plane as the collector region 11, which is in the IGBT cell. The body region 13 in the diode cell is also called the anode region. The trench gates formed in the diode cell are all the dummy gates G3. The potential level of the dummy fate G3 is the same as the emitter's potential level. The body region 13 in the diode cell is at the emitter's potential level (GND). The charge accumulation region 10b formed at the IGBT cell is also shared with the diode cell.

Figure 5:
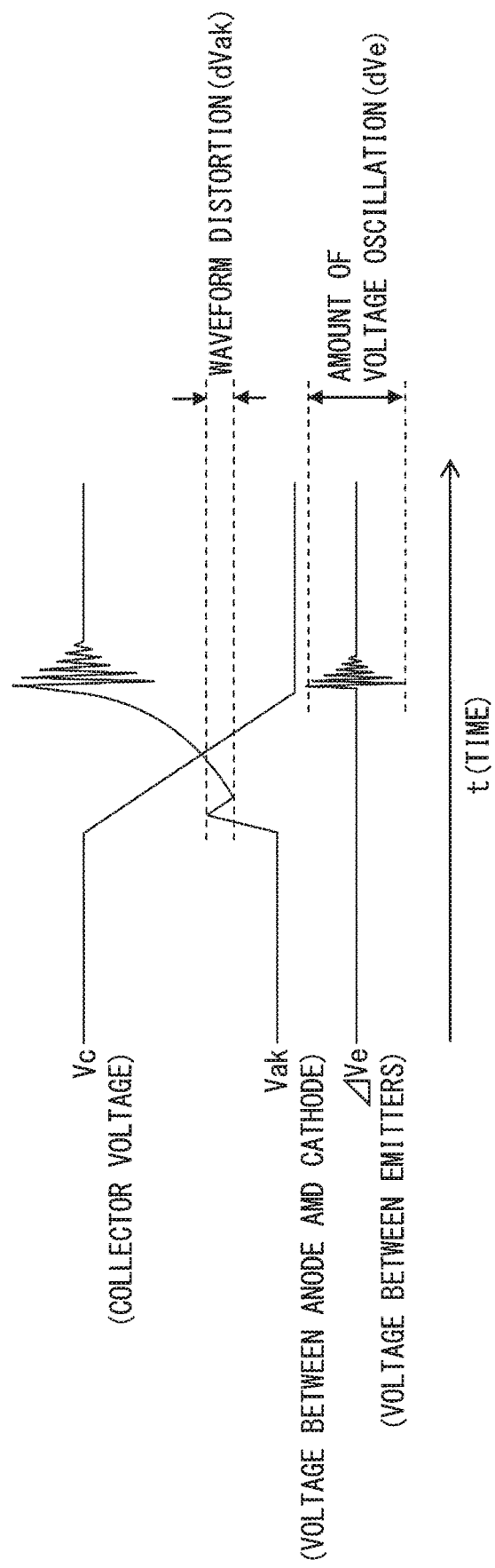
FIG. 5 illustrates variations in a collector voltage, and anode-cathode voltage and an emitter voltage.

The following describes the behaviors of the collector voltage Vc in the switching device 110, voltage difference ΔVe between the respective emitters of the two IGBT devices connected in parallel, and voltage Vak between anode and cathode of the diode cell with reference to FIG. 5. The potential differences respectively indicated by dVe and dVak are illustrated in FIG. 1.

As illustrated in FIG. 5, when a gate voltage is applied to the active gates G1, G2 and G4, the IGBT device is turned on. This situation causes the collector voltage to be lowered. On the other hand, the voltage Vak across the both ends of the freewheeling diode device Di rises.

Vak gets lower subsequent to the rising of Vak in a situation where the collector voltage Vc starts to get lower, and then Vak subsequently rises again. The difference between the maximum value related to the initial rising of Vak and the minimum value related to the lowering of Vak is defined as the waveform distortion dVak caused by the freewheeling diode Di.

When the value of the collector voltage Vc gets lower and is substantially converged to a predetermined value, Vak stops to rise and substantially reaches to a predetermined value. At this moment, voltage oscillation is generated caused by the parasitic inductance L. The emitter voltage Ve also has voltage oscillation caused by the parasitic inductance L, and the voltage between the respective emitters of two IGBT devices connected in parallel is in oscillation. The maximum value of the amplitude of vibration is defined as voltage vibration dVe.

Although FIG. 5 illustrates the waveform distortion dVak and the voltage oscillation dVe caused by the situation of turning on the IGBT device Tr, it may also be applied to the situation of turning off the IGBT device Tr.

Figure 6:
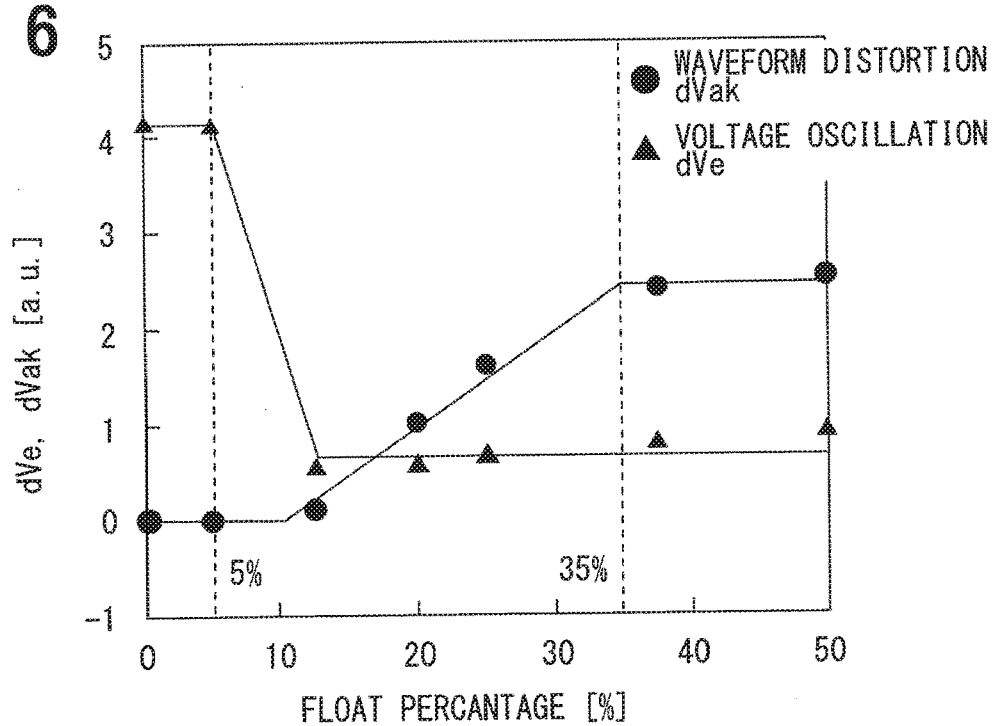
FIG. 6 illustrates variations in the waveform distortion and the voltage oscillation with respect to the percentage of float cells.

Next, with reference to FIG. 6, the effects of adopting the semiconductor device 100 in the present embodiment will be described.

The float ratio refers to the number of float cells with respect to the total number of active cells and the active dummy cells. The present inventor acquires the variations of the waveform distortion and the voltage oscillation dVe with respect to the float ratio. FIG. 6 is a graph showing the result of the simulation.

According to FIG. 5, it is possible to suppress the voltage oscillation dVe when the float ratio is larger than or equal to 5% as compared with the float ratio smaller than 5%. It is possible to suppress waveform distortion dVak when the float ratio is smaller than or equal to 35% as compared with the float ratio being larger than 35%. In other words, it is possible to reduce voltage oscillation and waveform distortion when the float ratio is larger than and equal to 5% and the float ratio is smaller than and equal to 35%.

The switching device 110 according to the present embodiment includes the charge accumulation region 10b having a higher impurity concentration as a portion of the drift region 10. It is possible to reduce the turn-on voltage as compared with the situation where the charge accumulation region 10b is not formed. In other words, the switching device 110 can suppress an increase in turn-on voltage while reducing the voltage oscillation and waveform distortion.

Other Embodiments

While embodiments of the present disclosure have been described above, the present disclosure is not limited in any way by the embodiments described above, and may be carried out with various modifications without departing from the scope of the subject matter of the present disclosure.

The above embodiment describes the switching device 110 provided with the charge accumulation region 10b. However, the charge accumulation region 10b is not an essential configuration as long as it satisfies the requirement of lowering the turn-on voltage. A field stop region may be formed between the drift region 10 and the collector region 11 or the cathode region 12.

The above embodiment describes an example of arranging the active gates G1, G2, G4 and the dummy gate G3 alternately. However, it is not limited to the above example. As long as the ratio of the number of float cells to the total number of the active cells and the active dummy cells is set in a range of 5% to 35%, for example, one dummy gate may be formed with respect to two active gates.

Figure 7:
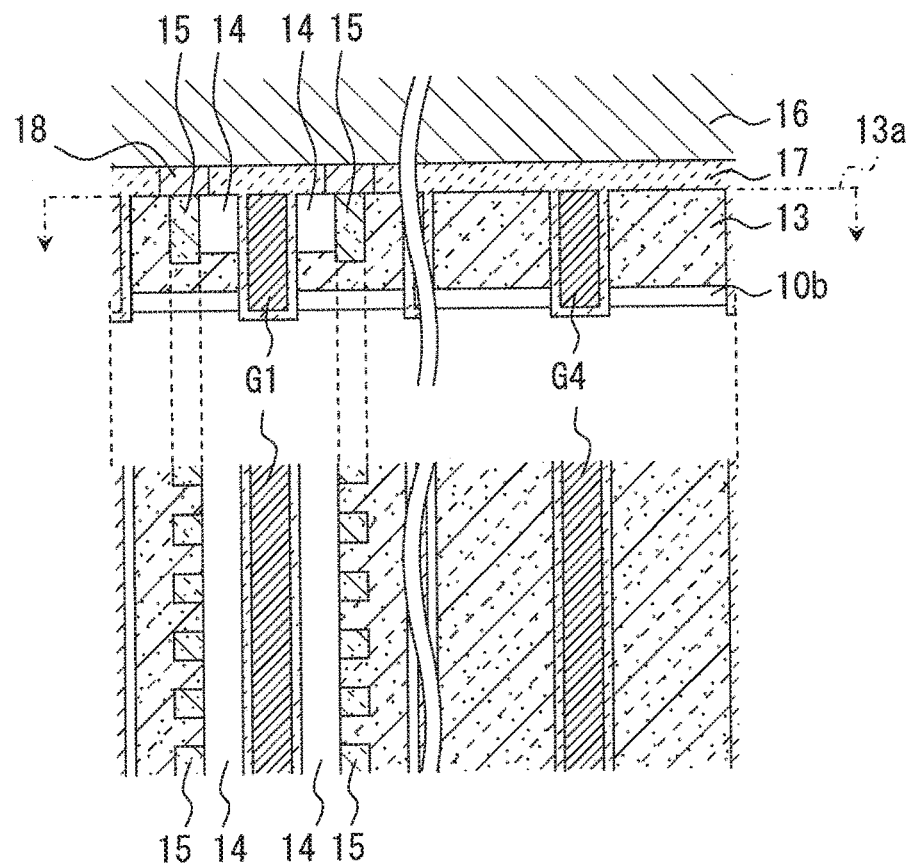
FIG. 7 is a cross-sectional view of ac active cell and a float cell with regard to the other embodiment in detail.

The above embodiment describes an example where the contact region 15 is extended along the trench gate, the contact region 15 may also formed in a dotted shape as shown in FIG. 7. According to this configuration, it is preferable to use a tungsten plug 18 in the junction between the emitter electrode 16 and the contact region 15.

The present embodiment describes an example of RC-IGBT in which the IGBT device Tr in the cell region of the switching device 110 and the freewheeling diode Di are arranged together. However, the IGBT and the freewheeling diode may be respectively provided as individual chips, and are connected in parallel.

The present disclosure has been described with reference to the embodiments as described above, but the present disclosure should not be limited to these embodiments or the configurations. The present disclosure can include various modification examples as well as modifications made within equivalent ranges. Furthermore, various combinations and formations, and other combinations and formations including one or more than one or less than one element may be included in the scope and the spirit of the present disclosure.

The invention claimed is:

1. A semiconductor device comprising:
    a plurality of insulated-gate bipolar transistor (IGBT) devices; and
    a freewheeling diode provided for each of the IGBT devices, wherein:
        the plurality of IGBT devices are connected in parallel to be driven;
        each of the IGBT devices includes:
            a collector region having a first conductivity type;
            a drift region having a second conductivity type stacking on the collector region;
            a body region having the first conductivity type stacking on the drift region;
            a plurality of trench gates penetrating the body region and reaching the drift region; and
            an emitter region surrounded by the body region and in contact with at least one of the plurality of trench gates through an insulation film;
        each of the IGBT devices further includes:
            an active cell having at least one of the trench gates applied with a gate voltage, and having the emitter region;
            a dummy cell having at least one of the trench gates at a same potential level as the emitter region, and without the emitter region; and
            an active dummy cell having at least one of the trench gates applied with the gate voltage, and without the emitter region;
        the active dummy cell includes a float cell in which the body region is in an electrically floating condition; and
        a ratio of a number of the float cell to a total number of the active cell and the active dummy cell is larger than or equal to 5% and is smaller than or equal to 35%.

2. The semiconductor device according to claim 1, wherein:
    the drift region includes a charge accumulation region at a region in contact of the body region; and
    the charge accumulation region has a higher impurity concentration as compared with other regions of the drift region.

3. The semiconductor device according to claim 1, wherein
    the freewheeling diode is in a cell region provided with the IGBT device.

4. The semiconductor device according to claim 1, wherein
    the freewheeling diode is outside of a cell region, the cell region provided with the IGBT device.

* * * * *